United States Patent
Levy et al.

(10) Patent No.: US 11,264,457 B1
(45) Date of Patent: Mar. 1, 2022

(54) ISOLATION TRENCHES AUGMENTED WITH A TRAP-RICH LAYER

(71) Applicant: GLOBALFOUNDRIES U.S. Inc., Santa Clara, CA (US)

(72) Inventors: Mark Levy, Williston, VT (US); Siva P. Adusumilli, South Burlington, VT (US); Steven M. Shank, Jericho, VT (US); Alvin J. Joseph, Williston, VT (US); Anthony K. Stamper, Williston, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/953,897

(22) Filed: Nov. 20, 2020

(51) Int. Cl.
*H01L 29/06* (2006.01)
*H01L 21/763* (2006.01)
*H01L 27/06* (2006.01)
*H01L 21/762* (2006.01)

(52) U.S. Cl.
CPC .... *H01L 29/0649* (2013.01); *H01L 21/76224* (2013.01); *H01L 21/763* (2013.01); *H01L 27/0652* (2013.01)

(58) Field of Classification Search
CPC .......... H01L 29/0649; H01L 21/76224; H01L 21/763; H01L 21/00; H01L 21/2018; H01L 27/0652
USPC .......... 257/505, 506; 438/207.218, 219, 294, 438/427
See application file for complete search history.

(56) References Cited

U.S. PATENT DOCUMENTS

| | | | |
|---|---|---|---|
| 5,929,481 | A | 7/1999 | Hshieh et al. |
| 8,525,260 | B2 | 9/2013 | Li et al. |
| 8,642,440 | B2 | 2/2014 | Pei et al. |
| 10,192,779 | B1 | 1/2019 | Shank et al. |
| 10,224,396 | B1 | 3/2019 | Shank et al. |
| 10,643,927 | B1 | 5/2020 | Shank et al. |
| 10,832,940 | B2 | 11/2020 | Shank et al. |
| 2009/0140338 | A1* | 6/2009 | Gauthier, Jr. et al. ...... H01L 21/336 257/350 |

OTHER PUBLICATIONS

Adusumilli et al. "Buried Damage Layers for Electrical Isolation", filed Mar. 2, 2020 as U.S. Appl. No. 16/806,383.
Shank et al. "Multi-Depth Regions of High Resistivity in a Semiconductor Substrate", filed Oct. 10, 2019 as U.S. Appl. No. 16/598,064.
Shank et al. "Bulk Substrates With a Self-Aligned Buried Polycrystalline Layer", filed Nov. 2, 2020 as U.S. Appl. No. 17/086,925.

* cited by examiner

*Primary Examiner* — Thinh T Nguyen
(74) *Attorney, Agent, or Firm* — Thompson Hine LLP; Francois Pagette

(57) ABSTRACT

Semiconductor structures with electrical isolation and methods of forming a semiconductor structure with electrical isolation. A shallow trench isolation region, which contains a dielectric material, is positioned in a semiconductor substrate. A trench extendes through the shallow trench isolation region and to a trench bottom in the semiconductor substrate beneath the shallow trench isolation region. A dielectric layer at least partially fills the trench. A polycrystalline region, which is arranged in the semiconductor substrate, includes a portion that is positioned beneath the trench bottom.

20 Claims, 10 Drawing Sheets

ISOLATION TRENCHES AUGMENTED WITH A TRAP-RICH LAYER

BACKGROUND

The present invention relates to semiconductor device fabrication and integrated circuits and, more specifically, to semiconductor structures with electrical isolation and methods of forming a semiconductor structure with electrical isolation.

Semiconductor structures, such as semiconductor devices designed to operate at radiofrequencies, are susceptible to performance degradation from various mechanisms. For example, device performance may be degraded during radiofrequency operation due to poor device isolation from harmonic generation and high parasitic loss.

Improved semiconductor structures with electrical isolation and methods of forming a semiconductor structure with electrical isolation are needed.

SUMMARY

In an embodiment of the invention, a structure includes a semiconductor substrate, a shallow trench isolation region, which is comprised of a dielectric material, in the semiconductor substrate, a trench extending through the shallow trench isolation region and to a trench bottom in the semiconductor substrate beneath the shallow trench isolation region, and a dielectric layer at least partially filling the trench. A polycrystalline region, which is arranged in the semiconductor substrate, includes a portion that is positioned beneath the trench bottom.

In an embodiment of the invention, a method includes forming a shallow trench isolation region comprised of a dielectric material in a semiconductor substrate, forming a trench extending through the shallow trench isolation region and to a trench bottom in the semiconductor substrate beneath the shallow trench isolation region, and at least partially filling the trench with a dielectric layer. The method further includes forming a polycrystalline region in the semiconductor substrate. The polycrystalline region includes a portion positioned beneath the trench bottom.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
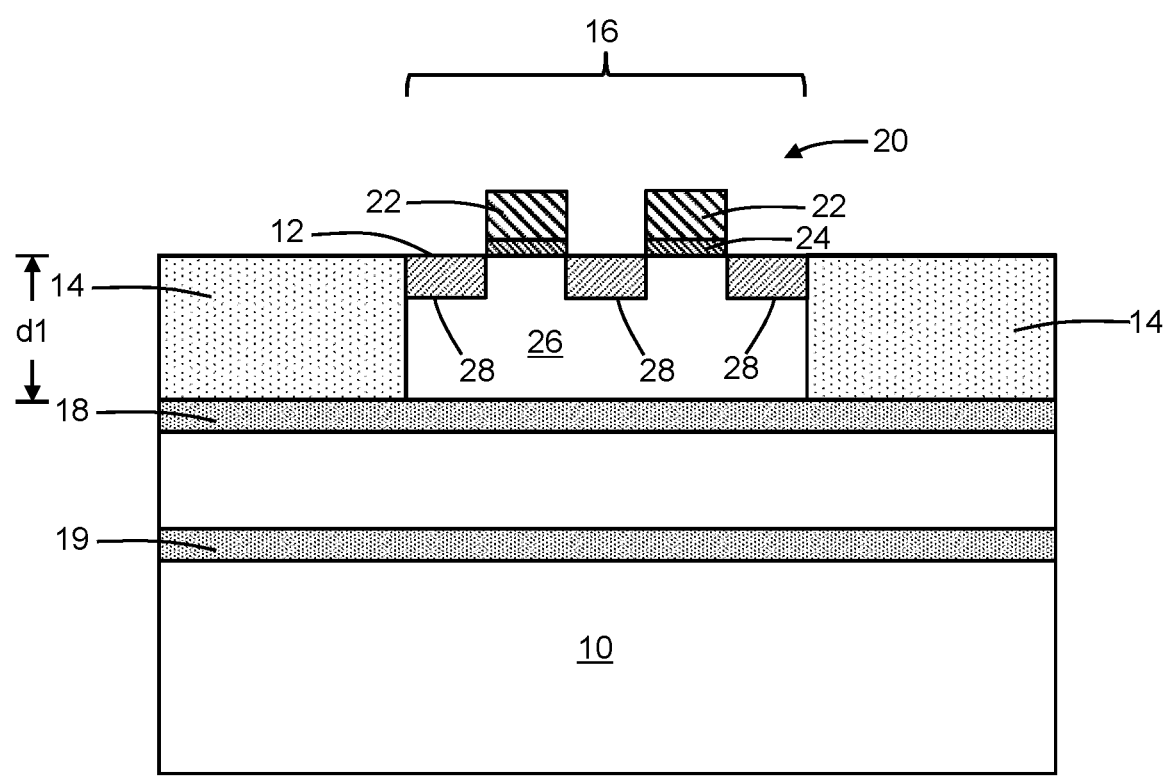
FIGS. 1-5 are cross-sectional views of a structure at successive fabrication stages of a processing method in accordance with embodiments of the invention.

With reference to FIG. 1 and in accordance with embodiments of the invention, a semiconductor substrate 10 is provided that contains a single-crystal semiconductor material, such as single-crystal silicon. The semiconductor substrate 10 may be a bulk substrate (i.e., a non-silicon-on-insulator or non-SOI substrate) containing single-crystal semiconductor material (e.g., single-crystal silicon), which may be crystalline with a crystal structure but also have a finite level of defectivity. As used herein, a non-SOI substrate lacks a buried oxide layer. In an embodiment, the semiconductor substrate 10 may be a high-resistivity bulk substrate containing single-crystal silicon having an electrical resistivity greater than or equal to 1,000 ohm-cm. In an embodiment, the semiconductor substrate 10 may be a high-resistivity bulk substrate containing single-crystal silicon having an electrical resistivity within a range from 1,000 ohm-cm to 50,000 ohm-cm. In an embodiment, the semiconductor substrate 10 may contain single-crystal semiconductor material lightly-doped with a p-type dopant (e.g., boron) to provide p-type electrical conductivity.

A shallow trench isolation region 14 is formed that extends from a top surface 12 of the semiconductor substrate 10 to a shallow depth, d1, into the semiconductor substrate 10. The shallow trench isolation region 14 may contain a dielectric material deposited by chemical vapor deposition into trenches patterned in the semiconductor substrate 10, polished, and deglazed. The dielectric material contained in the shallow trench isolation region 14 may comprise silicon dioxide, silicon nitride, silicon carbide, silicon-rich silicon dioxide, low-K SiCOH, or a combination of two or more of these materials. The shallow trench isolation region 14 surrounds a portion of the semiconductor substrate 10 to define a device region 16.

Polycrystalline layers 18, 19 may be positioned in the semiconductor substrate 10 beneath the device region 16. The polycrystalline layer 18 may be coextensive with the shallow trench isolation region 14, and the polycrystalline layer 19 may be located at a greater depth in the semiconductor substrate 10 than the polycrystalline layer 18 such that the polycrystalline layer 18 is positioned between the polycrystalline layer 19 and the top surface 12 of the semiconductor substrate 10 and between the polycrystalline layer 19 and the polycrystalline layer 18. The polycrystalline layers 18, 19 may extend in planes horizontally parallel or substantially parallel to the top surface 12.

The polycrystalline layers 18, 19 have a different crystallinity than the single-crystal semiconductor material of the semiconductor substrate 10 that is positioned between the polycrystalline layers 18, 19, above the polycrystalline layer 18, and below the polycrystalline layer 19. In an embodiment, the polycrystalline layers 18, 19 may contain grains of polycrystalline semiconductor material layer having an electrical resistivity that is greater than the electrical resistivity of the single-crystal semiconductor material of the semiconductor substrate 10. In an embodiment, the polycrystalline layers 18, 19 may have an electrical resistivity that is greater than or equal to 1,000 ohm-cm. In an embodiment, the electrical resistivity of the polycrystalline layers 18, 19 may be within a range of about 10,000 ohm-cm to about 1,000,000 ohm-cm. In an embodiment, the single-crystal semiconductor material of the semiconductor substrate 10 may have an electrical resistivity of about 1,000 ohm-cm to about 10,000 ohm-cm, and the polycrystalline layers 18, 19 may have an electrical resistivity that is about 10 times to about 100 times greater (i.e., within a range of about 10,000 ohm-cm to about 1,000,000 ohm-cm).

In an embodiment, the polycrystalline layers 18, 19 may be formed by forming damaged or amorphous semiconductor material in the semiconductor substrate 10 beneath the top surface 12 of the semiconductor substrate 10 and converting at least a portion of the damaged semiconductor material into polycrystalline semiconductor material. The damaged or amorphous semiconductor material may be formed in the semiconductor substrate 10 by an ion implantation process implanting, for example, argon ions, under a given set of implantation conditions. The conversion from damaged or amorphous semiconductor material to polycrystalline semiconductor material may be accomplished by performing a thermal treatment (i.e., an annealing process). In an embodiment, the thermal treatment may involve rapid thermal processing at, for example, 1000° C. for less than 10 seconds. In an embodiment, the thermal treatment recrystallizes the semiconductor surface and leaves individual polysilicon layers embedded below the top surface 12 as the polycrystalline layers 18, 19. In an embodiment, the polycrystalline layer 18 may be thicker beneath the shallow trench isolation region 14 than beneath the device region 16. In an embodiment, the polycrystalline layer 19 may be omitted by adjusting, for example, the distribution of damaged or amorphous semiconductor material that is formed by the ion implantation process in the semiconductor substrate 10.

A field-effect transistor 20 may be formed by bulk (i.e. non-SOI) substrate complementary-metal oxide-semiconductor (CMOS) processes as a semiconductor device structure in the device region 16 of the semiconductor substrate 10. The field-effect transistor 20 may include a gate electrode 22 comprised of a conductor, such as doped polycrystalline silicon (i.e., doped polysilicon) or a work function metal, and a gate dielectric 24 comprised of an electrical insulator, such as silicon dioxide or hafnium oxide. The gate electrode 22 and gate dielectric 24 may be formed by depositing a layer stack and patterning the layer stack with photolithography and etching processes. The field-effect transistor 20 may further include halo regions, lightly-doped drain extensions, a semiconductor body 26 provided by a portion of semiconductor material of the semiconductor substrate 10 in the device region 16, source/drain regions 28, and sidewall spacers on the gate electrode 22. In an embodiment, the field-effect transistor 20 may be a switch field-effect transistor designed for radiofrequency operation.

The source/drain regions 28 are doped to have an opposite conductivity type from the semiconductor substrate 10 and semiconductor body 26. In an embodiment, the field-effect transistor 20 may be an n-type field-effect transistor. In that instance, the source/drain regions 28 may contain semiconductor material doped with an n-type dopant (e.g., arsenic, antimony, and/or phosphorus) to provide n-type electrical conductivity, and the semiconductor substrate 10 and semiconductor body 26 may contain semiconductor material doped with a p-type dopant (e.g., boron or indium) to provide p-type electrical conductivity. The polarity of the dopant types may be swapped such that the field-effect transistor 20 is a p-type field-effect transistor instead of an n-type field-effect transistor.

Figure 2:
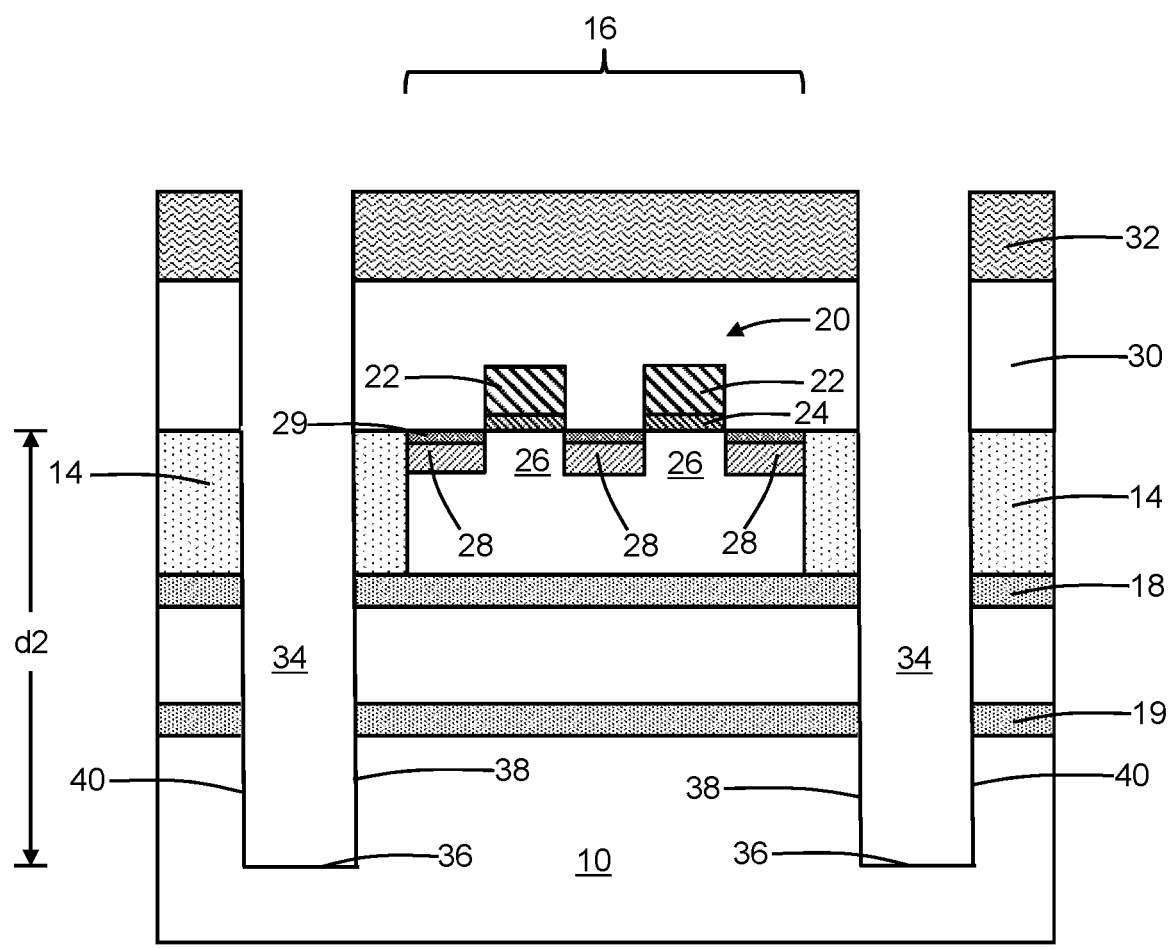

With reference to FIG. 2 in which like reference numerals refer to like features in FIG. 1 and at a subsequent fabrication stage of the processing method, a silicide layer 29 may be formed by a silicidation process that includes sections on the source/drain regions 28 and, optionally, a section on the gate electrode 22. Following formation of the silicide layer 29, dielectric layers 30 are formed over the shallow trench isolation region 14, device region 16, and field-effect transistor 20. The dielectric layers 30 may include a conformal layer containing silicon nitride and a dielectric layer containing borophosphosilicate glass or silicon dioxide that is deposited as a blanket layer over the conformal layer and then planarized by chemical-mechanical polishing to remove topography.

A trench 34 is formed that extends through the dielectric layers 30 and the shallow trench isolation region 14 and into a portion of the semiconductor substrate 10 beneath the shallow trench isolation region 14. To that end, a sacrificial mask 32 is formed over the dielectric layers 30. The sacrificial mask 32 may include a layer of a light-sensitive material, such as a photoresist, applied by a spin-coating process, pre-baked, exposed to light projected through a photomask, baked after exposure, and developed with a chemical developer to define an opening arranged over the area to be etched to define the trench 34.

The trench 34 may be surrounded by side surfaces or sidewalls 38, 40 that extend to a trench bottom 36. Similar to the shallow trench isolation region 14, the trench 34 may surround the device region 16 and may also surround a portion of the semiconductor substrate 10 beneath the device region 16. A portion of the trench 34 may be positioned within the shallow trench isolation region 14, and a portion of the trench 34 may be positioned in the semiconductor substrate 10 beneath the shallow trench isolation region 14. The polycrystalline layer 18 may fully separate the portion of the semiconductor substrate 10 surrounded by the shallow trench isolation region 14 from the portion of the semiconductor substrate 10 surrounded by the trench 34. The trench bottom 36 may be located at a depth, d2, in the semiconductor substrate 10 relative to the top surface 12 (FIG. 1) that is greater than the depth, d1, of the shallow trench isolation region 14. For example, the trench 34 may extend from the top surface 12 to a depth at the trench bottom 36 of about 80 microns to about 100 microns. The trench 34 may also penetrate in a vertical direction completely through both of the polycrystalline layers 18, 19.

The sidewalls 38, 40 may have any of various different profiles. In the representative embodiment, the sidewalls 38, 40 are planar and oriented perpendicular or substantially perpendicular relative to the top surface 12. In an alternative embodiment, the sidewalls 38, 40 may include scallops that are produced by a Bosch etching process. In an alternative embodiment, a sidewall smoothing process may be used subsequent to the Bosch etching process to remove the scallops from the sidewalls 38, 40. In an alternative embodiment, the sidewalls 38, 40 may be inclined relative to the top surface 12 and converge with increasing distance from the trench bottom 36. In an alternative embodiment, the sidewalls 38, 40 may be inclined relative to the top surface 12 and diverge with increasing distance from the trench bottom 36.

Figure 3:
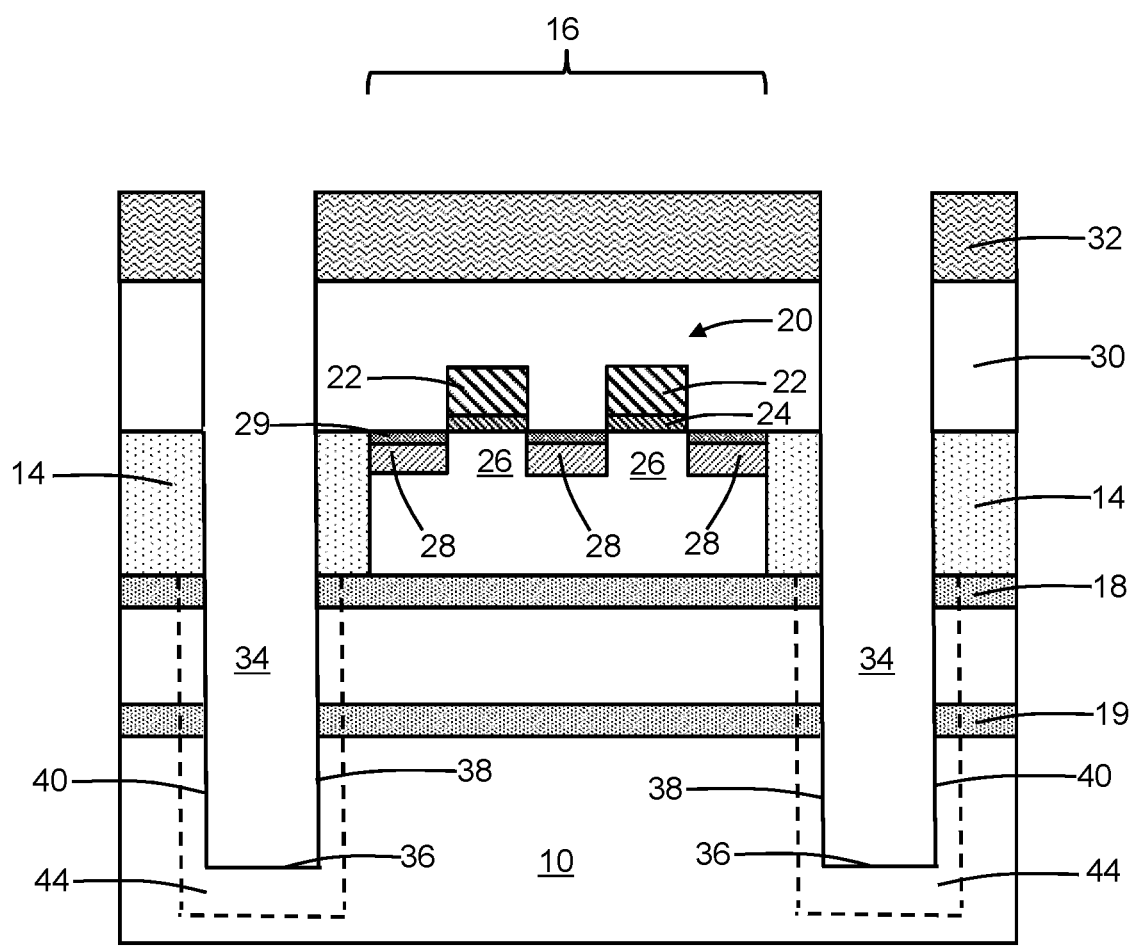

With reference to FIG. 3 in which like reference numerals refer to like features in FIG. 2 and at a subsequent fabrication stage of the processing method, an implanted region 44 containing damaged or amorphous semiconductor material is formed in a portion of the semiconductor substrate 10 adjacent to and beneath the trench bottom 36 and in portions of the semiconductor substrate 10 adjacent to the sidewalls 38, 40 of the trench 34. The sacrificial mask 32 used to pattern the trench 34 may also function as an implantation mask that blocks implantation of the semiconductor substrate 10 in the device region 16.

The implanted region 44 may be formed by an ion implantation process that introduces energetic ions with ion trajectories that are directed into the trench bottom 36 and sidewalls 38, 40 of the trench 34. The energetic ions lose energy along their paths in the semiconductor substrate 10 via stochastic scattering events with atomic nuclei and electrons in the traversed semiconductor material. Energy lost in nuclear collisions displaces target atoms of the semiconductor substrate 10 from their original lattice sites, which damages its crystal lattice structure. The crystal lattice structure of the semiconductor substrate 10 is damaged or amorphized within the implanted region 44 in comparison with undamaged regions of the single-crystal semiconductor material of the semiconductor substrate 10 either masked during the implantation process or beyond the ion range relative to the trench bottom 36 and sidewalls 38, 40.

The ions may be generated from a suitable source gas and implanted into the semiconductor substrate 10 surrounding the trench 34 with given implantation conditions using an ion implantation tool. The implantation conditions (e.g., ion species, dose, energy, tilt angle(s)) for the ion implantation process may be selected to tune the characteristics of the implanted region 44. In an embodiment, the ion species is not electrically active in the semiconductor material of the semiconductor substrate 10. In an embodiment, the ions may be generated from a noble gas, such as argon or xenon. In an embodiment, the dose of argon ions may be greater than or equal to $1 \times 10^{14}$ ions/cm$^2$. In an embodiment, the dose of argon ions may range from about $1 \times 10^{14}$ ions/cm$^2$ to about $5 \times 10^{15}$ ions/cm$^2$. In an embodiment, the energy of the argon ions may range from about 30 keV to about 1000 keV. The dose and energy for other implanted noble gas ion species may be similar to, or different from, those of argon. The ion implantation conditions may include a single implantation, multiple implantations, multiple implantations performed at different tilt angles, different energies, segmented implantations, etc. In an embodiment, the implanted region 44 may be formed by at least one implantation may be performed at normal incidence and at least one implantation may be performed at a tilt angle.

In an embodiment, the thickness of the implanted region 44 adjacent the sidewalls 38, 40 of the trench 34 may be increased if the sidewalls 38, 40 are inclined relative to the top surface 12 and diverge with increasing distance from the trench bottom 36. The sidewall inclination may improve the coverage of the implantation forming the implanted region 44 in the portions of the semiconductor substrate 10 adjacent to the sidewalls 38, 40 of the trench 34 by increasing the accessibility for the ion trajectories.

Figure 4:
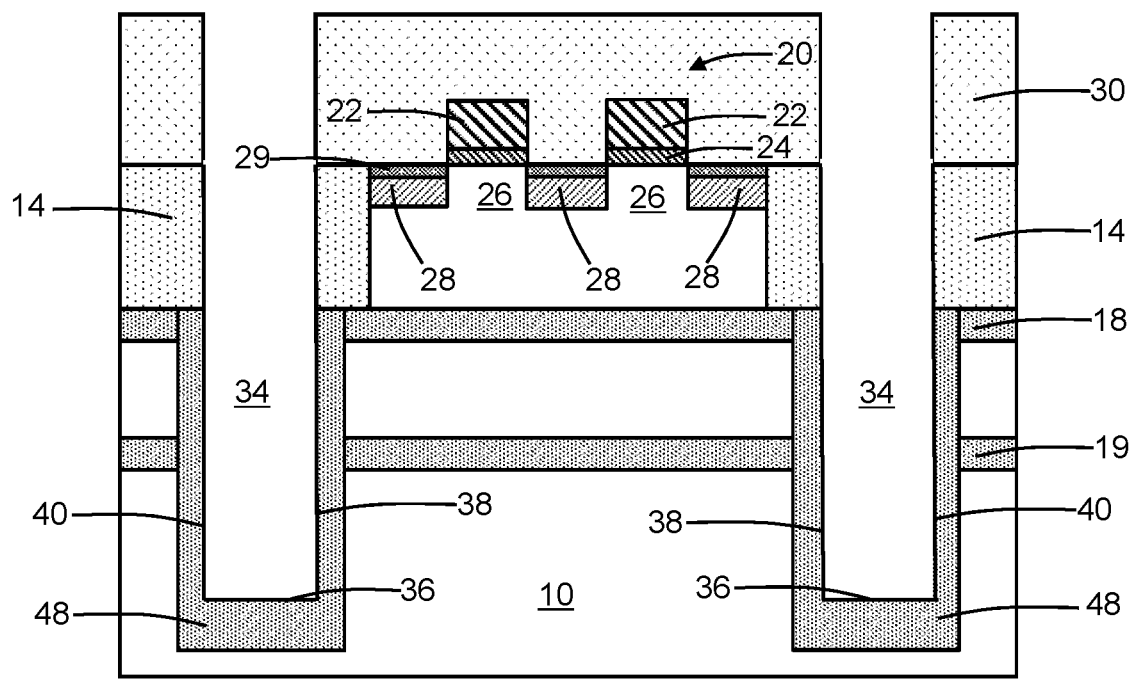

With reference to FIG. 4 in which like reference numerals refer to like features in FIG. 3 and at a subsequent fabrication stage of the processing method, the sacrificial mask 32 is removed, and the damaged or amorphous semiconductor material in the implanted region 44 is converted into a polycrystalline region 48 by performing a thermal treatment (i.e., annealing process). In an embodiment, the thermal treatment used to thermally treat the implanted region 44 and form the polycrystalline region 48 may be a rapid thermal anneal. In an embodiment, the rapid thermal anneal may be performed using, for example, a bank of flash lamps that heat the semiconductor substrate 10 to a peak temperature in a range of 900° C. to 1125° C. with a dwell time at the peak temperature of 30 milliseconds to 5 seconds and, in a particular embodiment, the peak temperature may be 1000° C. held for a dwell time of less than or equal to 1 second. Alternatively, the thermal treatment may include one or more furnace anneals performed within a temperature range of 900° C. to 1100° C.

The polycrystalline region 48 contains polycrystalline semiconductor material (e.g., polysilicon) and, in particular, grains of polycrystalline semiconductor material. The polycrystalline region 48 may also contain defects as residual damage in addition to the polycrystalline grains, and the defects may contain trapped atoms of the implanted species (e.g., argon or xenon). In contrast to the polycrystalline region 48, the semiconductor material of the semiconductor substrate 10 that is arranged about the trench 34 and polycrystalline region 48 has a crystal lattice structure and lacks grains.

The polycrystalline region 48 is positioned in the semiconductor substrate 10 adjacent to the trench 34 and, more specifically, portions of the polycrystalline region 48 are positioned in the semiconductor substrate 10 adjacent to the sidewalls 38, 40 and the trench bottom 36 of the trench 34. In an embodiment, the portion of the polycrystalline region 48 adjacent to the trench bottom 36 is coextensive with (i.e., shares a boundary with) the trench bottom 36. In an embodiment, the portions of the polycrystalline region 48 adjacent to the sidewalls 38, 40 are coextensive with the sidewalls 38, 40. In an embodiment, the portion of the polycrystalline region 48 adjacent to the trench bottom 36 is coextensive with the trench bottom 36, and the portions of the polycrystalline region 48 adjacent to the sidewalls 38, 40 are coextensive with the sidewalls 38, 40. In an embodiment, the different portions of the polycrystalline region 48 adjacent to the sidewalls 38, 40 and the trench bottom 36 are continuous and unbroken. In an embodiment, the portions of the polycrystalline region 48 adjacent to the sidewalls 38, 40 may extend from the shallow trench isolation region 14 to the portion of the polycrystalline region 48 at and beneath the trench bottom 36. The polycrystalline layers 18, 19 may extend fully beneath the device region 16 to the polycrystalline region 48 to define respective horizontal strips of polycrystalline semiconductor material. In an embodiment, the portion of the polycrystalline region 48 at and beneath the trench bottom 36 may be thicker than the portions of the polycrystalline region 48 adjacent to the sidewalls 38, 40 due to local differences in implantation depth.

The polycrystalline region 48 may be characterized as trap-rich material having an electrical resistivity that is greater than or equal to the electrical resistivity of the semiconductor material of the semiconductor substrate 10. In an embodiment, the polycrystalline region 48 may have an electrical resistivity that is greater than or equal to 1,000 ohm-cm. In an embodiment, the electrical resistivity of the polycrystalline region 48 may be within a range of about 10,000 ohm-cm to about 1,000,000 ohm-cm. In an embodiment, the electrical resistivity of the polycrystalline layers 18, 19 and the electrical resistivity of the polycrystalline region 48 may be equal or substantially equal.

Figure 5:
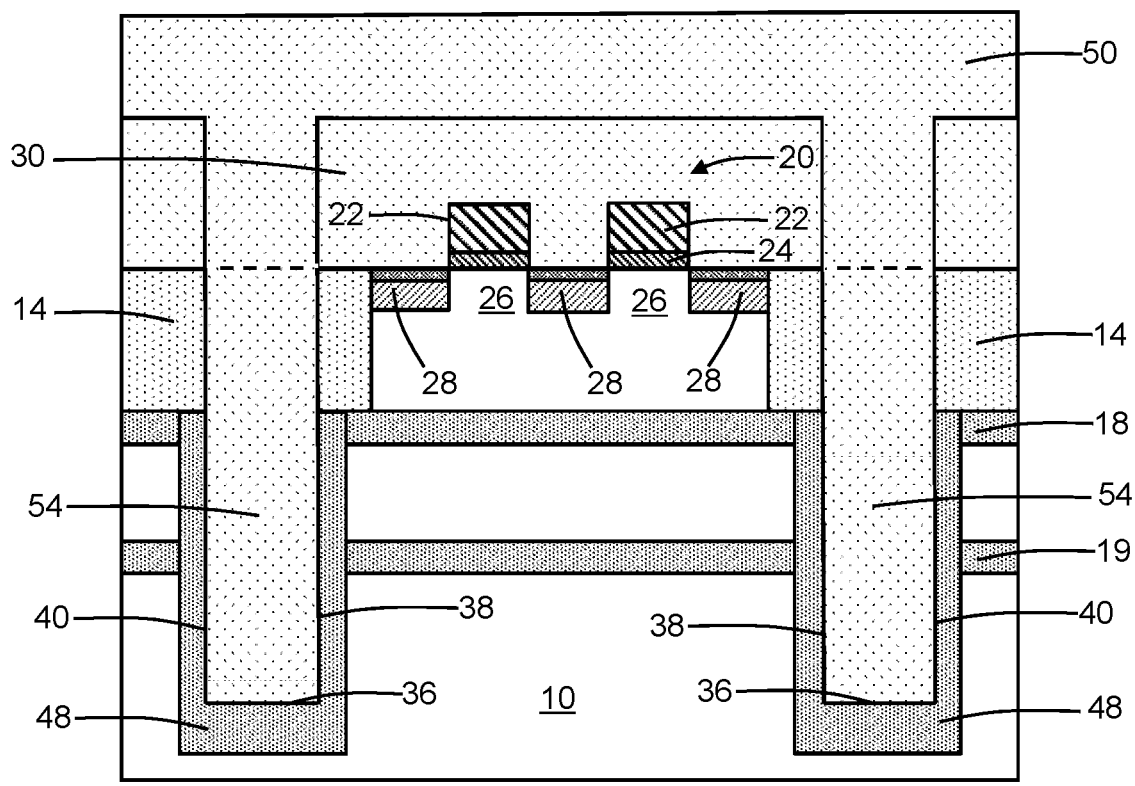

With reference to FIG. 5 in which like reference numerals refer to like features in FIG. 4 and at a subsequent fabrication stage of the processing method, a dielectric layer 50 may be deposited over the dielectric layers 30 and planarized by chemical-mechanical polishing to remove topography. Portions of the dielectric layer 50 may at least partially fill the trench 34 to define a deep trench isolation region 54 in the semiconductor substrate 10. The dielectric layer 50 may comprise a dielectric material, such as a borophosphosilicate glass or silicon dioxide, and may contain voids (not shown) defining air gaps. Middle-of-line processing and back-end-of-line processing follow, which includes formation of contacts, vias, and wiring for an interconnect structure that is coupled with the field-effect transistor 20.

The polycrystalline region 48 may enhance the electrical isolation for the field-effect transistor 20 during operation. The polycrystalline region 48, which is characterized by a high electrical resistance, may reduce harmonic generation and parasitic loss of the field-effect transistor 20 during operation. The polycrystalline region 48 effectively extends the depth of the deep trench isolation region 54 beyond the depth of the trench 34, and the polycrystalline region 48 is located along a potential current leakage path.

Figure 6:
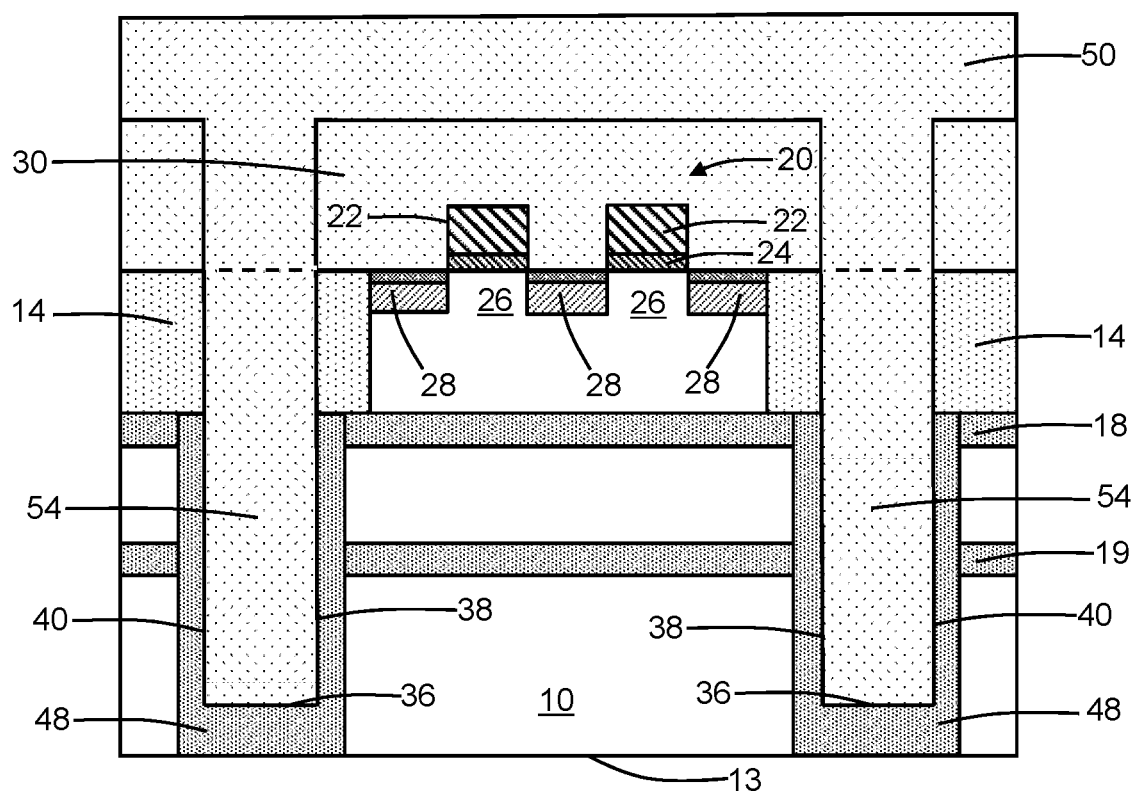
FIGS. 6-10 are cross-sectional views of structures in accordance with alternative embodiments of the invention.

With reference to FIG. 6 in which like reference numerals refer to like features in FIG. 5 and in accordance with alternative embodiments, the semiconductor substrate 10 may be thinned by backside grinding. The thinning of the semiconductor substrate 10 may result in the backside surface 13 of the semiconductor substrate 10, after thinning, intersecting and being coextensive with the portion of the polycrystalline region 48 beneath the trench bottom 36 of the trench 34.

Figure 7:
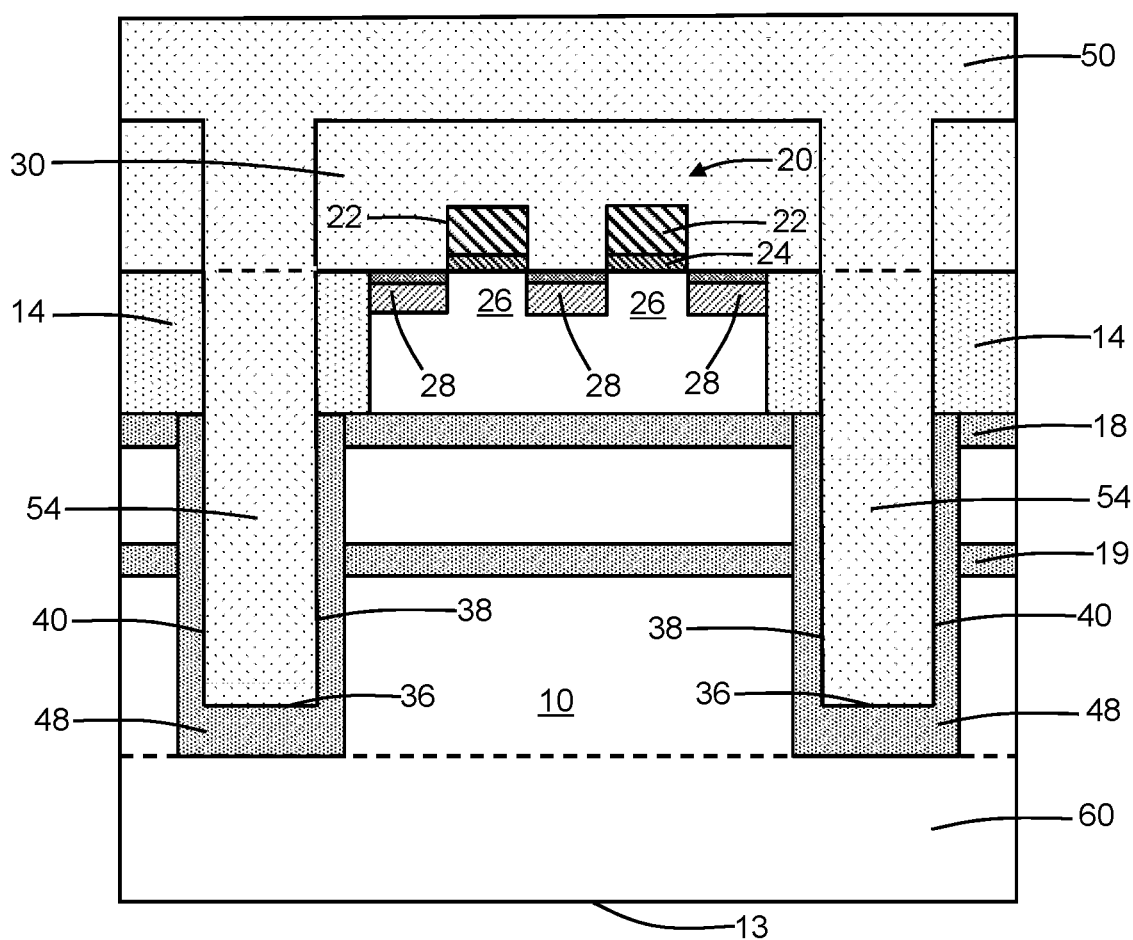

With reference to FIG. 7 in which like reference numerals refer to like features in FIG. 5 and in accordance with alternative embodiments, the semiconductor substrate 10 may be thinned by backside grinding, and an implanted layer 60 may be formed between the backside surface 13 and the portion of the polycrystalline region 48 beneath the trench bottom 36 of the trench 34. The implanted layer 60, which is located between the polycrystalline region 48 and the backside surface 13, may intersect and be coextensive with the portion of the polycrystalline region 48 beneath the trench bottom 36 of the trench 34.

Figure 8:
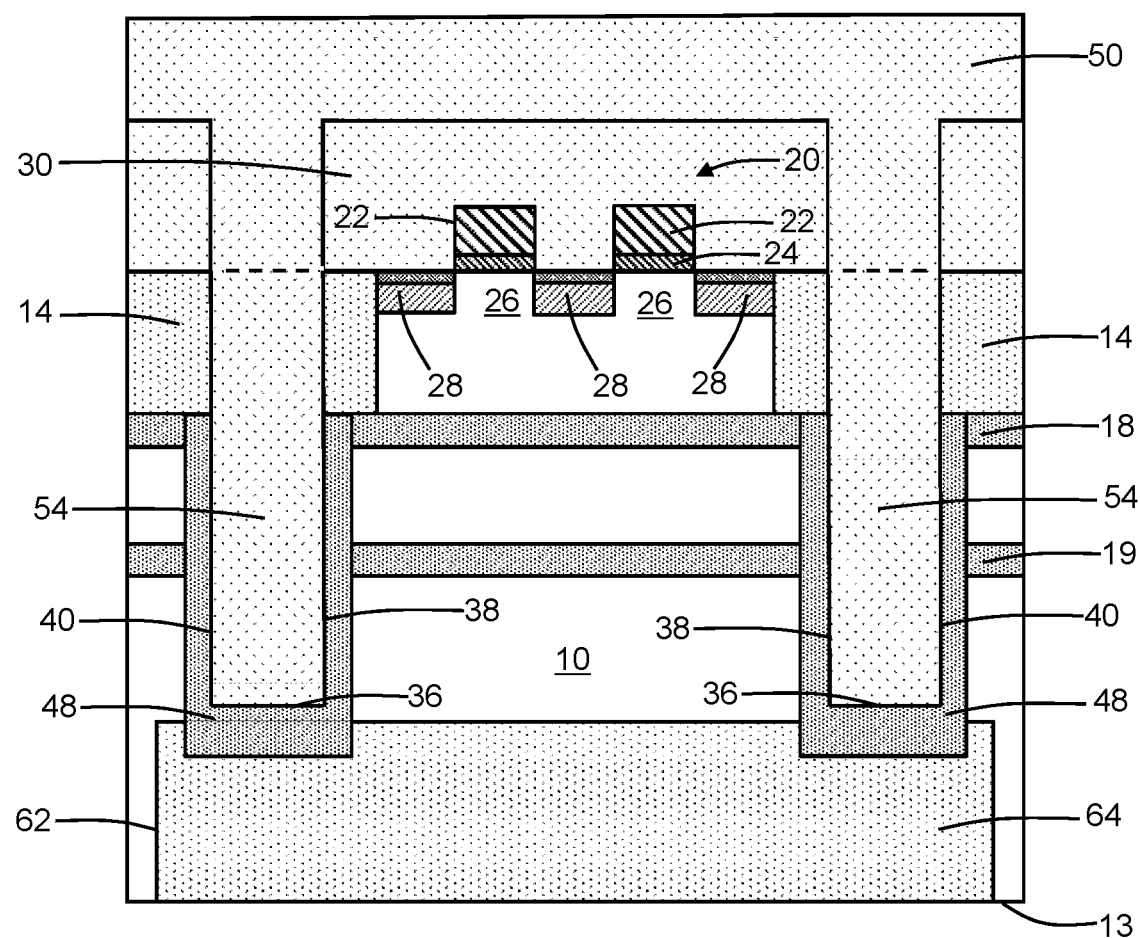

With reference to FIG. 8 in which like reference numerals refer to like features in FIG. 5 and in accordance with alternative embodiments, the semiconductor substrate 10 may be thinned by backside grinding and etched to define a trench 62 at the backside surface 13 that intersects and is coextensive with a portion of the polycrystalline region 48 beneath the trench bottom 36 of the trench 34. The trench 62 may be filled by a layer 64 containing an electrical insulator, such as silicon dioxide, or containing polysilicon.

Figure 9:
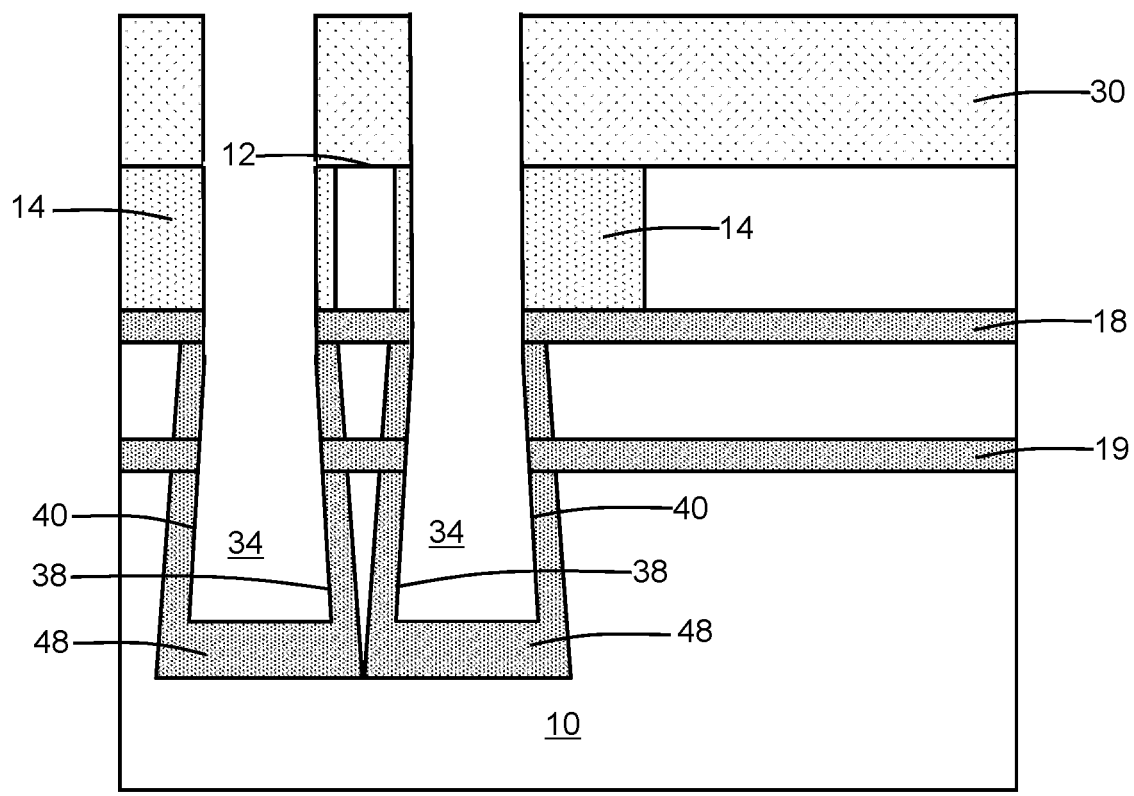

With reference to FIG. 9 in which like reference numerals refer to like features in FIG. 3 and in accordance with alternative embodiments, the trench 34 may be laterally positioned in the shallow trench isolation region 14 closer to the interface between the shallow trench isolation region 14 and the semiconductor material in the device region 16. The polycrystalline region 48 may overlap and merge proximate to the trench bottom 36 of the trench 34, which has sidewalls 38, 40 that are inclined relative to the top surface 12 and converge with increasing distance from the trench bottom 36. The polycrystalline region 48 may extend beneath the portion of the semiconductor substrate 10 surrounded by the shallow trench isolation region 14 and the portion of the semiconductor substrate surrounded by the trench 34. The overlap and merger of the polycrystalline region 48 may eliminate a need for measures to modify the backside surface 13.

Figure 10:
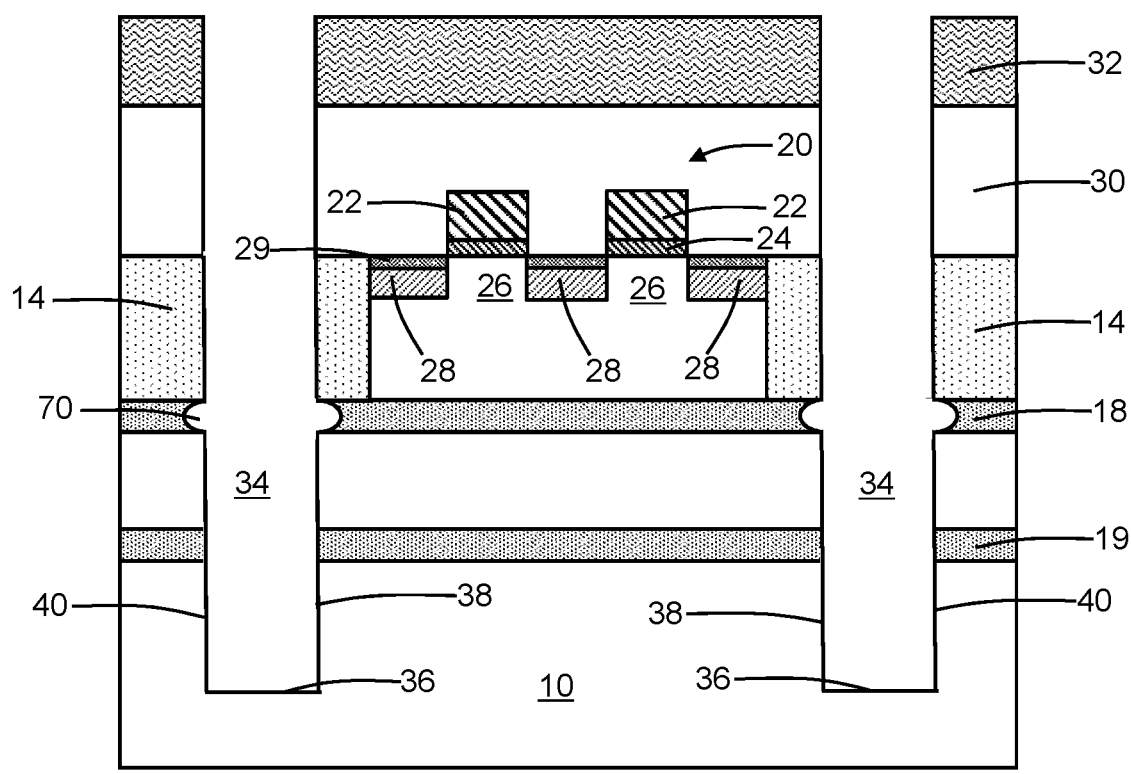

With reference to FIG. 10 in which like reference numerals refer to like features in FIG. 2 and in accordance with alternative embodiments, the sidewalls 38, 40 of the trench 34 may include recesses 70 that are formed in the semiconductor substrate 10 adjacent to the shallow trench isolation region 14. The recesses 70 may be formed by an etching process before the implanted region 44 is formed. The recesses 70 locally widen the trench 34 proximate to a bottom of the shallow trench isolation region 14. The local widening may improve the coverage of the implantation forming the implanted region 44 in the portions of the semiconductor substrate 10 adjacent to the trench bottom 36 and sidewalls 38, 40 of the trench 34 by increasing the accessibility for the ion trajectories. Portions of the dielectric layer 52 may fill the recesses 70 when the trench 34 is at least partially filled to define the deep trench isolation region 54.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate;
   a shallow trench isolation region in the semiconductor substrate, the shallow trench isolation region comprised of a first dielectric material;
   a first trench extending through the shallow trench isolation region and to a trench bottom in the semiconductor substrate beneath the shallow trench isolation region;
   a dielectric layer at least partially filling the first trench; and
   a polycrystalline region in the semiconductor substrate, the polycrystalline region including a first portion positioned beneath the trench bottom.

2. The structure of claim 1 wherein the first trench includes a first sidewall and a second sidewall that extend to the trench bottom, the polycrystalline region including a second portion that is positioned adjacent to the first sidewall, and the polycrystalline region including a third portion that is positioned adjacent to the second sidewall.

3. The structure of claim 2 wherein the first portion, the second portion, and the third portion of the polycrystalline region are continuous.

4. The structure of claim 2 wherein the shallow trench isolation region extends to a first depth in the semiconductor substrate, and the trench bottom is located at a second depth in the semiconductor substrate that is greater than the first depth.

5. The structure of claim 2 wherein the second portion of the polycrystalline region extends adjacent to the first sidewall from the shallow trench isolation region to the first portion of the polycrystalline region, and the third portion of the polycrystalline region extends adjacent to the second sidewall from the shallow trench isolation region to the first portion of the polycrystalline region.

6. The structure of claim 1 wherein the polycrystalline region has an electrical resistivity that is within a range of about 10,000 ohm-cm to about 1,000,000 ohm-cm.

7. The structure of claim 1 wherein the shallow trench isolation region surrounds a first portion of the semiconductor substrate, and further comprising:
a field-effect transistor including a source/drain region in the first portion of the semiconductor substrate.

8. The structure of claim 1 wherein the shallow trench isolation region extends to a first depth in the semiconductor substrate, the trench bottom is located at a second depth in the semiconductor substrate that is greater than the first depth, and the first portion of the polycrystalline region is coextensive with the trench bottom.

9. The structure of claim 1 further comprising:
a first polycrystalline layer in the semiconductor substrate, the first polycrystalline layer extending laterally in the semiconductor substrate to intersect the polycrystalline region.

10. The structure of claim 9 wherein the first polycrystalline layer is coextensive with the shallow trench isolation region.

11. The structure of claim 10 wherein the shallow trench isolation region surrounds a first portion of the semiconductor substrate, the first trench surrounds a second portion of the semiconductor substrate, and the first polycrystalline layer extends laterally beneath the second portion of the semiconductor substrate and separates the first portion of the semiconductor substrate from the second portion of the semiconductor substrate.

12. The structure of claim 10 wherein the semiconductor substrate has a top surface, and further comprising:
a second polycrystalline layer in the semiconductor substrate, the second polycrystalline layer extending laterally in the semiconductor substrate to intersect the polycrystalline region, the first polycrystalline layer positioned between the second polycrystalline layer and the top surface, and the first polycrystalline layer separated from the second polycrystalline layer by a crystalline semiconductor material of the semiconductor substrate.

13. The structure of claim 1 wherein the semiconductor substrate includes a top surface and a backside opposite to the top surface, the backside of the semiconductor substrate is coextensive with the first portion of the polycrystalline region.

14. The structure of claim 1 wherein the semiconductor substrate includes a top surface and a backside opposite to the top surface, and further comprising:
a second trench in the backside of the semiconductor substrate that is coextensive with the first portion of the polycrystalline region, the second trench containing a second dielectric material.

15. The structure of claim 1 wherein the semiconductor substrate includes a top surface and a backside opposite to the top surface, and further comprising:
an implanted layer between the backside of the semiconductor substrate and the first portion of the polycrystalline region, the implanted layer coextensive with the first portion of the polycrystalline region.

16. The structure of claim 1 wherein the shallow trench isolation region surrounds a first portion of the semiconductor substrate, the first trench surrounds a second portion of the semiconductor substrate, and the first portion of the polycrystalline region extends beneath the first portion and the second portion of the semiconductor substrate.

17. The structure of claim 1 wherein the trench includes a first sidewall and a second sidewall that extend to the trench bottom, the trench further includes a recess in the first sidewall, and the recess is positioned adjacent to the shallow trench isolation region.

18. A method comprising:
forming a shallow trench isolation region comprised of a dielectric material in a semiconductor substrate;
forming a trench extending through the shallow trench isolation region and to a trench bottom in the semiconductor substrate beneath the shallow trench isolation region;
filling at least a portion of the trench with a dielectric layer; and
forming a polycrystalline region in the semiconductor substrate,
wherein the polycrystalline region includes a first portion positioned beneath the trench bottom.

19. The method of claim 18 wherein the trench includes a first sidewall and a second sidewall that extend to the trench bottom, the polycrystalline region including a second portion that is positioned adjacent to the first sidewall, and the polycrystalline region including a third portion that is positioned adjacent to the second sidewall.

20. The method of claim 19 wherein the second portion of the polycrystalline region extends adjacent to the first sidewall from the shallow trench isolation region to the first portion of the polycrystalline region, and the third portion of the polycrystalline region extends adjacent to the second sidewall from the shallow trench isolation region to the first portion of the polycrystalline region.

* * * * *